(12) United States Patent
Zhou

(10) Patent No.: US 10,680,079 B2
(45) Date of Patent: Jun. 9, 2020

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/006,140

(22) Filed: Jun. 12, 2018

(65) Prior Publication Data
US 2018/0301542 A1    Oct. 18, 2018

(30) Foreign Application Priority Data
Jun. 15, 2017 (CN) .......................... 2017 1 0454254

(51) Int. Cl.
| | | |
|---|---|---|
| *H01L 29/66* | (2006.01) | |
| *H01L 29/78* | (2006.01) | |
| *H01L 21/02* | (2006.01) | |
| *H01L 29/06* | (2006.01) | |
| *H01L 21/762* | (2006.01) | |
| *H01L 29/165* | (2006.01) | |
| *H01L 29/08* | (2006.01) | |

(52) U.S. Cl.
CPC .... *H01L 29/66568* (2013.01); *H01L 21/0217* (2013.01); *H01L 21/762* (2013.01); *H01L 21/76224* (2013.01); *H01L 29/0649* (2013.01); *H01L 29/165* (2013.01); *H01L 29/66545* (2013.01); *H01L 29/78* (2013.01); *H01L 29/785* (2013.01); *H01L 29/7848* (2013.01); *H01L 29/0847* (2013.01)

(58) Field of Classification Search
CPC ........... H01L 29/66568; H01L 21/0217; H01L 21/762; H01L 21/76224; H01L 29/0649; H01L 29/78
See application file for complete search history.

(56) References Cited

U.S. PATENT DOCUMENTS

| | | | | |
|---|---|---|---|---|
| 2012/0032275 A1* | 2/2012 | Haran | ............... | H01L 21/28518 257/401 |
| 2013/0026570 A1* | 1/2013 | Fan | ......................... | H01L 21/84 257/347 |

(Continued)

FOREIGN PATENT DOCUMENTS

CN           103839813 A      6/2014

*Primary Examiner* — Fernando L Toledo
*Assistant Examiner* — Neil R Prasad
(74) *Attorney, Agent, or Firm* — Anova Law Group, PLLC

(57) ABSTRACT

A semiconductor structure and a method for fabricating the semiconductor structure are provided. The method includes forming a gate structure on a base substrate and forming a first dielectric layer on the base substrate. The first dielectric layer has a top lower than the gate structure and exposes a sidewall portion of the gate structure. The method also includes forming an isolation sidewall spacer on the exposed sidewall portion of the gate structure.

18 Claims, 7 Drawing Sheets

(56) References Cited

U.S. PATENT DOCUMENTS

| | | | |
|---|---|---|---|
| 2014/0124873 A1* | 5/2014 | Jagannathan | H01L 29/49 257/407 |
| 2014/0235044 A1* | 8/2014 | Liu | H01L 21/02107 438/585 |
| 2015/0333167 A1* | 11/2015 | Leobandung | H01L 29/0673 257/347 |
| 2017/0323954 A1* | 11/2017 | Tsai | H01L 29/0649 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710454254.4, filed on Jun. 15, 2017, the entirety of which is incorporated herein by reference.

FIELD OF THE DISCLOSURE

The present disclosure generally relates to the field of semiconductor manufacturing and, more particularly, relates to a semiconductor structure and fabrication method thereof.

BACKGROUND

With the development of integrated circuit towards ultra-large scale integrated circuit, circuit density in the integrated circuit keeps increasing, the number of components included in the integrated circuit keeps increasing, and the size of the components decreases accordingly. With the decreasing of the size of semiconductor structures, channels of devices in the semiconductor structures are shortened accordingly. Because the channel is shortened, the gradient channel approximation of the devices is no longer valid, and varieties of adverse physical effects (especially a short-channel effect) become prominent. The device performance and reliability degrade, which limits further reduction of the size of the devices.

To control the short-channel effect, further reduction of device size requires further increase of a gate capacitance. The increase of the gate capacitance can be achieved by reducing a thickness of a gate dielectric layer. However, the decrease of the thickness of the gate dielectric layer will lead to the increase of a gate leakage current. To suppress the gate leakage current, a metal gate structure has been used in the semiconductor structure. The metal gate structure includes a metal electrode and a high-K dielectric layer. The metal gate structure can effectively increase the gate capacitance, and at the same time, effectively suppress the gate leakage current.

As the circuit density increases, a wafer surface cannot provide enough area to fabricate connection lines. To meet interconnection requirements of size-reduced components, a design of two and more layers of multi-layer interconnection lines has become one of common methods used in ultra-large scale integrated circuit technology. Plugs are used to connect the different metal layers or connect the metal layer and the semiconductor device.

With the reduction of the size of device, the reliability of the semiconductor structure still needs to be improved. The disclosed methods and device structures are directed to solve one or more problems set forth above and other problems.

BRIEF SUMMARY OF THE DISCLOSURE

One aspect of the present disclosure includes a method for fabricating a semiconductor structure. The method includes forming a gate structure on a base substrate and forming a first dielectric layer on the base substrate. The first dielectric layer has a top lower than the gate structure and exposes a sidewall portion of the gate structure. The method also includes forming an isolation sidewall spacer on the exposed sidewall portion of the gate structure.

Another aspect of the present disclosure includes a semiconductor structure. The semiconductor structure includes a gate structure on a base substrate, and source and drain doped regions in the base substrate on both sides of the gate structure. The semiconductor structure also includes a first dielectric layer on the base substrate. The first dielectric layer has a top lower than the gate structure. Further, the semiconductor structure includes an isolation sidewall spacer disposed on a sidewall portion of the gate structure and above the first dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
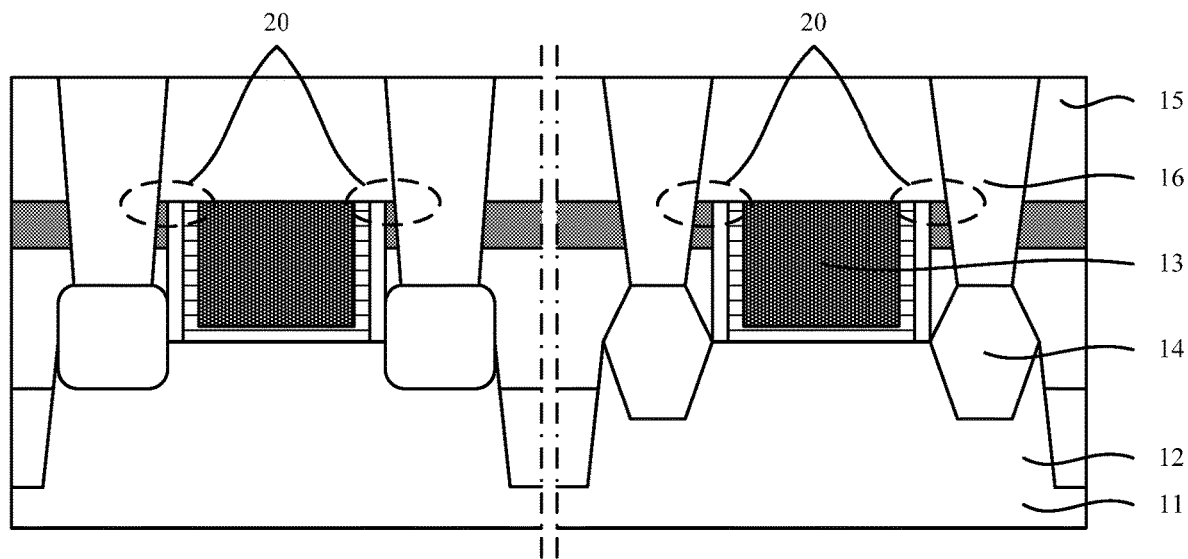
FIG. 1 illustrates a cross-sectional view of a semiconductor structure.

FIG. 1 illustrates a cross-sectional view of a semiconductor structure. Referring to FIG. 1, the semiconductor structure includes a substrate 11 having a fin 12 on the substrate 11, a metal gate structure 13, a source and drain doped region including a stress layer 14, an interlayer dielectric layer 15, and a plug 16 on the source and drain doped region. The metal gate structure 13 is across a length portion of the fin 12 and covers a portion of each of a top surface and sidewall surfaces of the fin 12. The stress layer 14 is located in the fin 12 on both sides of the metal gate structure 13. The interlayer dielectric layer 15 is located on the substrate 11, and covers the fin 12, the stress layer 14, and the metal gate structure 13. The plug 16 is electrically connected to the stress layer 14, and penetrates through the interlayer dielectric layer 15.

As the size of device decreases, a distance between the source and drain doped region and the metal gate structure 13 decreases, and a distance between the stress layer 14 and the metal gate structure 13 also decreases. The decreasing of the distance between the stress layer 14 and the metal gate structure 13 leads to a reduction of a distance between the plug 16 on the stress layer 14 and the metal gate structure 13.

This too small distance between the plug 16 and the metal gate structure 13 will degrade the performance of electrical isolation, and a breakdown issue between the plug 16 and the metal gate structure 13 (illustrated as a circle 20 in FIG. 1) is likely to occur.

Moreover, to increase a contact area of the plug 16 and to reduce a contact resistance, a radial size of the plug 16 gradually increases in a direction away from the source and drain doped region. Therefore, a distance between the plug 16 and a top of the metal gate structure 13 becomes smaller, and the breakdown issue is more likely to occur, thereby affecting the reliability of the formed semiconductor structure.

Figure 10:
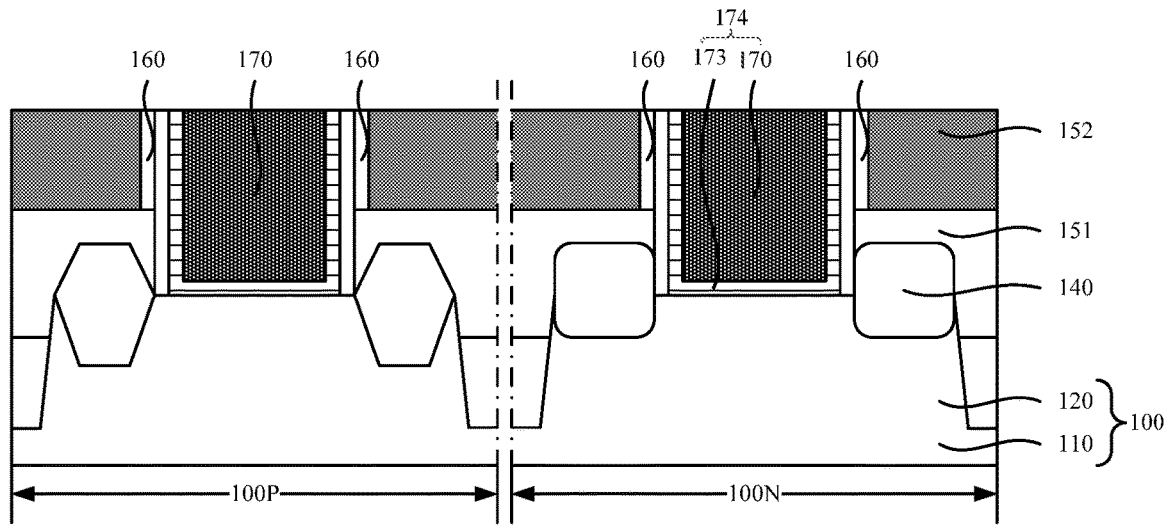
Figure 11:
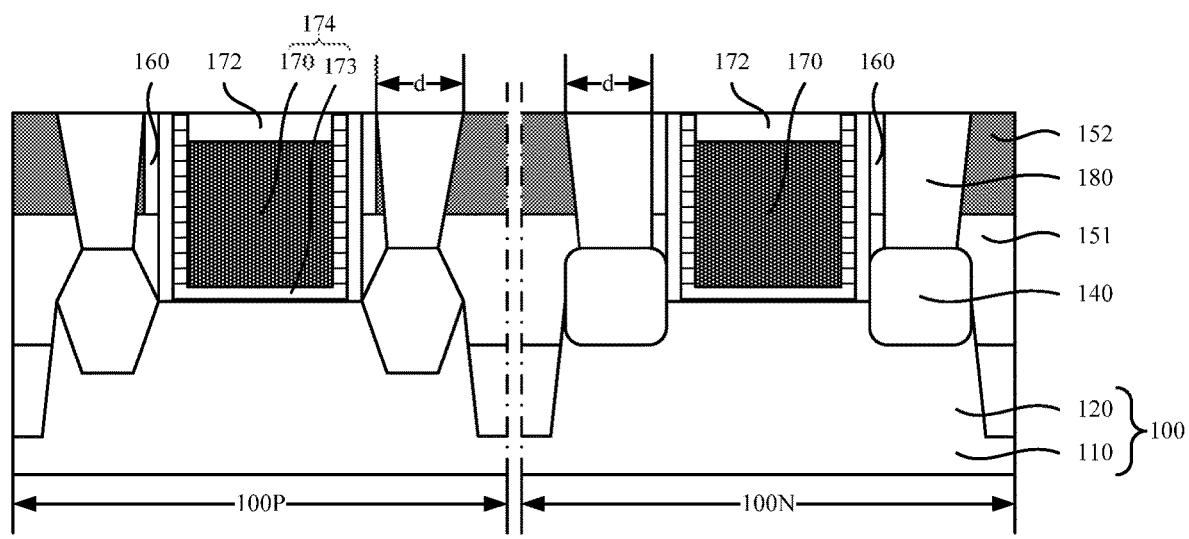
Figure 12:
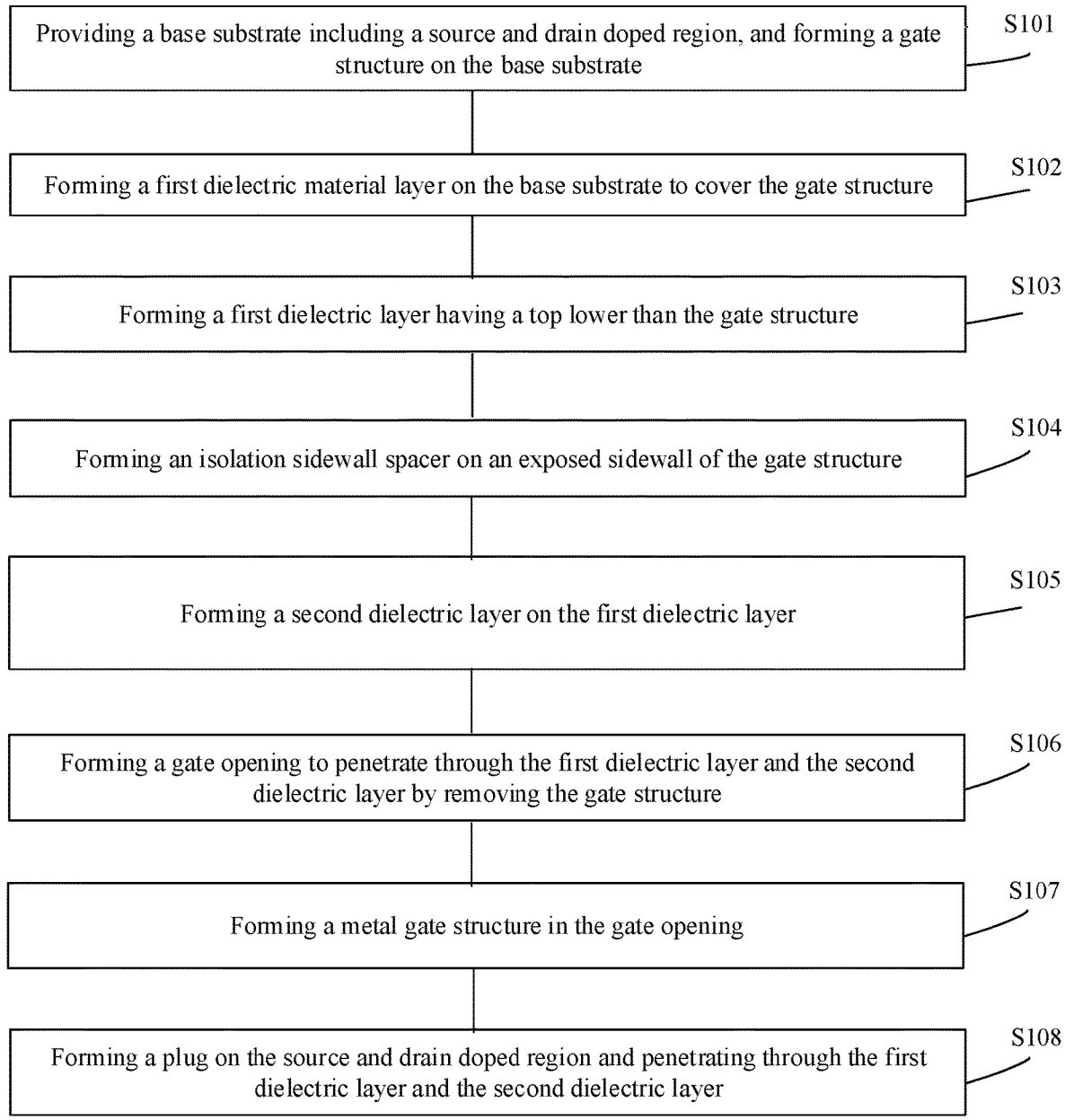
FIG. 12 illustrates an exemplary fabrication method for forming a semiconductor structure consistent with various disclosed embodiments of the present disclosure.

The present disclosure provides a semiconductor structure and fabrication method thereof. An isolation sidewall spacer may be formed on a sidewall surface of a gate structure to improve the performance of electrical isolation between the gate structure and a subsequently formed plug, thereby improving the reliability of the formed semiconductor structure. FIG. 12 illustrates an exemplary fabrication method for forming a semiconductor structure consistent with various disclosed embodiments of the present disclosure; and FIGS. 2-11 illustrate semiconductor structures corresponding to certain stages of the exemplary fabrication method.

Figure 2:
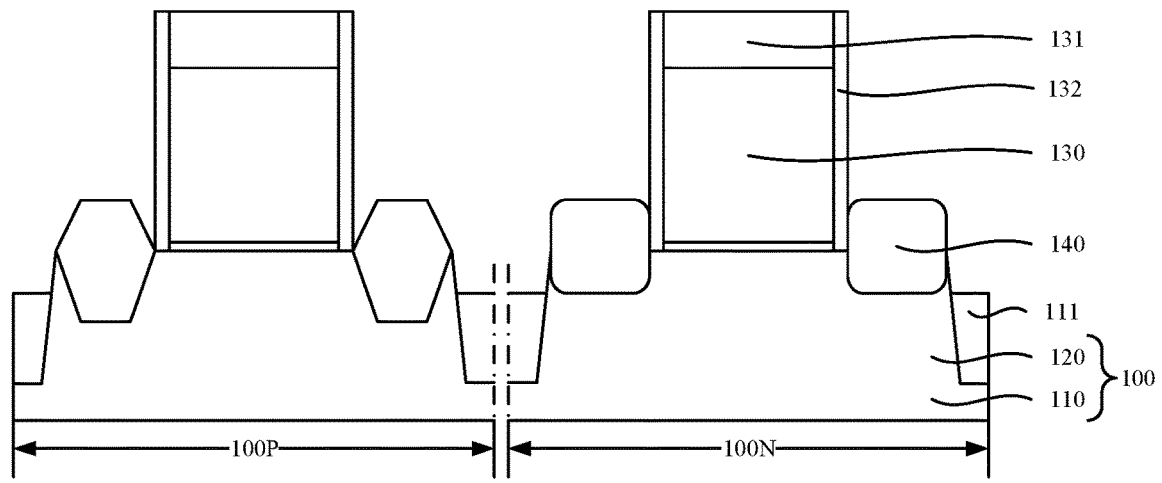
FIGS. 2-11 illustrate semiconductor structures corresponding to certain stages for forming an exemplary semiconductor structure consistent with various disclosed embodiments of the present disclosure.

As shown in FIG. 12, at the beginning of the fabrication method, a base substrate with certain structures may be provided (S101). FIG. 2 illustrates a corresponding semiconductor structure.

Referring to FIG. 2, a base substrate 100 may be provided. A gate structure may be formed on the base substrate 100. The base substrate 100 may provide an operation platform for subsequent processes.

In one embodiment, the formed semiconductor structure may include a CMOS device. The base substrate 100 may include a PMOS region 100P for forming a PMOS device and an NMOS region 100N for forming an NMOS device. In another embodiment, the formed semiconductor device may include one of a PMOS device and an NMOS device, the base substrate may include a corresponding one of the PMOS region and the NMOS region.

In one embodiment, the PMOS region 100P of the base substrate 100 may be spaced apart from the NMOS region 100N of the base substrate 100. In another embodiment, the PMOS region 100P of the base substrate 100 may be disposed adjacent to the NMOS region 100N of the base substrate 100.

In one embodiment, the formed semiconductor structure may include a fin structure, and the base substrate 100 may include a substrate 110 and a plurality of discrete fins 120 on the substrate 110. In another embodiment, the formed semiconductor structure may include a planar structure, and the base substrate may include a planar substrate. The substrate 110 may provide an operation platform for subsequent processes. A channel of the formed semiconductor structure may be located in the fin 120.

In one embodiment, the substrate 110 may be made of monocrystalline silicon. In another embodiment, the substrate may be made of polysilicon, amorphous silicon, amorphous germanium, germanium, silicon germanium, silicon carbide, gallium arsenide, or indium gallium, etc. In certain embodiments, the substrate may be made of a silicon on insulator (SOI) substrate, a germanium on insulator (GOI) substrate, a glass substrate, and other types of substrates. The substrate may be made of materials adaptable to process requirements and easy for integration.

In one embodiment, the fin 120 may be made of a same material as the substrate 110. Both the fin 120 and the substrate 110 may be made of monocrystalline silicon. In another embodiment, the fin may be made of a material different from the substrate. The fin may be made of amorphous germanium, germanium, silicon germanium, silicon carbide, gallium arsenide, or indium gallium, etc.

In one embodiment, the substrate 110 and the fin 120 may be formed at the same time. Forming the substrate 110 and the fin 120 may include: providing an initial substrate; forming a patterned fin mask layer (not illustrated) on a surface of the initial substrate; and etching the initial substrate using the fin mask layer as a mask to remove portions of the initial substrate, thereby the substrate 110 and the fin 120 protruding on the substrate 110 may be formed. In one embodiment, after forming the substrate 110 and the fin 120, the fin mask layer may be removed to expose a top surface of the fin 120. In another embodiment, after forming the substrate 110 and the fin 120, the fin mask layer may be retained to protect the top surface of the fin 120 in subsequent processes.

In one embodiment, an isolation layer 111 may be formed on the base substrate 100 and formed between adjacent fins 120. The isolation layer 111 may cover a portion of the sidewall surfaces of the fin 120, and a top of the isolation layer 111 may be lower than the top of the fin 120. The isolation layer, as an isolation structure of the semiconductor structure, may electrically isolate the adjacent devices and the adjacent fins. The isolation layer 111 may be formed on the substrate 110 exposed by the fin 120, and a height of the isolation layer 111 may be lower than a height of the fin 120. In one embodiment, the isolation layer 111 may be made of silicon oxide. In another embodiment, the isolation layer may be made of silicon nitride, silicon oxynitride, or other suitable insulating material(s).

In one embodiment, forming the isolation layer 111 may include: forming an isolation material layer (not illustrated) on the substrate 110 exposed by the fin 120, where the isolation material layer may cover the top of the fin 120; removing the isolation material layer above the top of the fin 120 by polishing; and removing a thickness portion of the remaining isolation material layer along a direction perpendicular to the surface of the base substrate by back-etching to expose the top and a portion of the sidewall surfaces of the fin 120, thereby the isolation layer may be formed. When the fin mask layer is retained after forming the substrate 110 and the fin 120, the fin mask layer may protect the top of the fin 120 during the back-etching process. After forming the isolation layer 111, the fin mask layer may be removed to expose the top of the fin 120.

In one embodiment, the gate structure may be a dummy gate structure 130 for occupying a space for subsequently forming a metal gate structure. In another embodiment, the gate structure may be a gate structure of the formed semiconductor structure for controlling turn-on and turn-off of the channel of the formed semiconductor structure.

In one embodiment, the base substrate 100 may include the substrate 110 and the fin 120. Therefore, the dummy gate structure 130 may be across the length portion of the fin 120 and cover a portion of each of the top and the sidewall surfaces of the fin 120.

In one embodiment, the dummy gate structure 130 may be a stacked-layer structure. The dummy gate structure 130 may include a dummy gate dielectric layer (not illustrated) and a dummy gate layer (not illustrated) on the dummy gate dielectric layer. In another embodiment, the dummy gate structure may be a single-layer structure. Correspondingly, the dummy gate structure may include the dummy gate layer.

In one embodiment, the dummy gate dielectric layer may be made of silicon oxide. In another embodiment, the dummy gate dielectric layer may be made of silicon oxynitride. In one embodiment, the dummy gate layer may be made of polysilicon. In another embodiment, the dummy gate layer may be made of silicon oxide, silicon nitride, silicon oxynitride, silicon carbide, silicon carbonitride, silicon oxycarbonitride, or amorphous carbon, etc.

In one embodiment, forming the dummy gate structure 130 may include: forming an oxide material layer on a surface of the fin 120 exposed by the isolation layer; forming a dummy gate material layer on the oxide material layer; forming a patterned gate mask 131 on the surface of the dummy gate material layer; and etching the dummy gate material layer until the oxide material layer is exposed by using the patterned gate mask 131 as a mask to form the dummy gate layer on the oxide material layer. The dummy gate layer may be across the length portion of the fin 120 and cover a portion of each of the top and the sidewall surfaces of the fin 120. Forming the dummy gate structure 130 may also include removing the oxide material layer exposed by the dummy gate layer to expose the surface of the fin 120. The remaining oxide material layer covered by the dummy gate layer may be used as the dummy gate dielectric layer. The dummy gate dielectric layer may be across the length portion of the fin 120 and cover a portion of each of the top and the sidewall surfaces of the fin 120.

In one embodiment, after forming the dummy gate structure 130, the gate mask 131 on a top of the dummy gate structure 130 may be retained. In one embodiment, the gate mask 131 may be made of silicon nitride. In another embodiment, the gate mask 131 may be made of silicon oxynitride, silicon carbide, or boron nitride, etc. The gate mask 131 may protect the top of the dummy gate structure 130 during subsequent processes.

After forming the dummy gate structure 130, a sidewall spacer 132 may be formed on a sidewall surface of the dummy gate structure 130. The sidewall spacer 132 may protect the dummy gate structure 130 and define a position of a subsequently formed source and drain doped region. The sidewall spacer 132 may be made of silicon oxide, silicon nitride, silicon carbide, silicon carbonitride, silicon oxycarbonitride, silicon oxynitride, boron nitride, or boron carbonitride, etc. The sidewall spacer may be a single-layer structure, or a stacked-layer structure. In one embodiment, the sidewall spacer 132 may be a single-layer structure, and may be made of silicon nitride.

In one embodiment, a source and drain doped region may be formed in the base substrate 100 on both sides of the gate structure. The source and drain doped region may be used to form a source region and a drain region of the semiconductor structure.

Referring back to FIG. 2, in one embodiment, the source and drain doped region may include a stress layer 140. Forming the source and drain doped region may include: forming the stress layer 140 in the fin 120 on both sides of the dummy gate structure 130; and forming the source and drain doped region by doping the stress layer 140.

In one embodiment, the semiconductor structure may be used to form a CMOS device, and the base substrate 100 may include the PMOS region 100P and the NMOS region 100N. The source and drain doped region formed in the PMOS region 100P of the base substrate 100 may be a P-type source and drain doped region. That is, the stress layer 140 in the PMOS region 100P of the base substrate 100 may be made of silicon germanium or silicon, and may be doped with P-type ions, such as B, Ga, or In, etc. The source and drain doped region formed in the NMOS region 100N of the base substrate 100 may be an N-type source and drain doped region. That is, the stress layer 140 in the NMOS region 100N of the base substrate 100 may be made of silicon carbon or silicon, and may be doped with N-type ions, such as P, As, or Sb, etc.

In one embodiment, after forming the dummy gate structure 130 and before forming the sidewall spacer 132, a lightly doped drain (LDD) implantation may be performed on the fin on both sides of the dummy gate structure 130 to improve the performance of the formed semiconductor structure.

Figure 3:
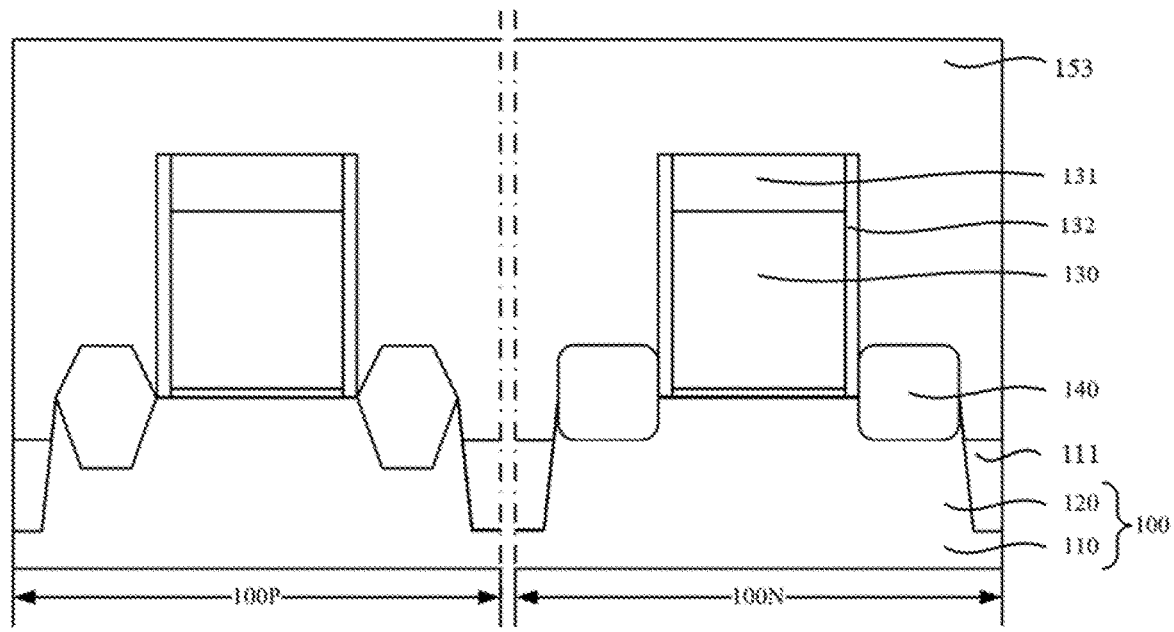

Returning to FIG. 12, after providing the base substrate, a first dielectric material layer may be formed (S102). FIG. 3 illustrates a corresponding semiconductor structure.

Referring to FIG. 3, a first dielectric material layer 153 may be formed on the base substrate 100. In one embodiment, the first dielectric material layer 153 may cover the dummy gate structure 130. In one embodiment, the gate mask 131 may be formed on the dummy gate structure 130, and a top of the first dielectric material layer 153 may be above a top of the gate mask 131. Therefore, the first dielectric material layer 153 may cover the isolation layer 111, the fin 120, and the dummy gate structure 130.

In one embodiment, the first dielectric material layer 153 may be formed by a flowable chemical vapor deposition (FCVD) process. Because the flowable chemical vapor deposition process forms the first dielectric material layer 153 by curing a fluid or a semi-fluid, the flowable chemical vapor deposition process may have desired gap-filling ability and may effectively reduce voids in the formed first dielectric material layer 153, thereby facilitating improving the quality of a subsequently formed interlayer dielectric layer.

In one embodiment, the first dielectric material layer 153 may be made of silicon oxide. In another embodiment, the first dielectric material layer 153 may be made of silicon nitride, silicon oxynitride, and other suitable dielectric material(s).

Figure 4:
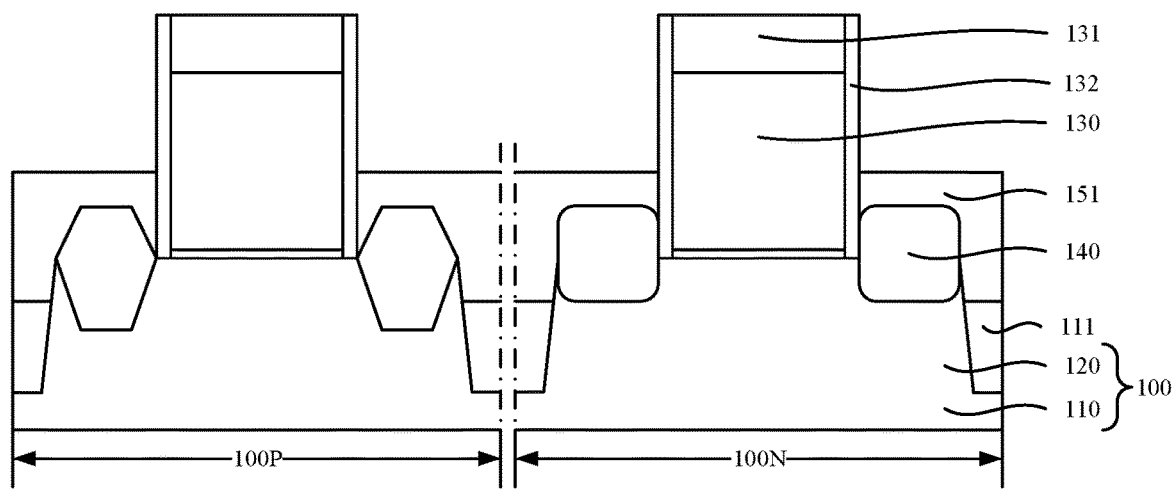

Returning to FIG. 12, after forming the first dielectric material layer, a first dielectric layer may be formed (S103). FIG. 4 illustrates a corresponding semiconductor structure.

Referring to FIG. 4, a first dielectric layer 151 may be formed by removing a thickness portion of the first dielectric material layer 153 along a direction perpendicular to the surface of the base substrate. A top of the first dielectric layer 151 may be lower than the top of the gate structure. The first dielectric layer 151 may be used to form an interlayer dielectric layer to electrically isolate the adjacent semiconductor structures.

Removing the thickness portion of the first dielectric material layer 153 may enable the top of the first dielectric layer 151 to be lower than the top of the gate structure. Therefore, the sidewall surface of the gate structure may be exposed, providing a process platform for subsequently forming an isolation sidewall spacer on the sidewall surface of the gate structure.

In one embodiment, the sidewall spacer 132 may be formed on the sidewall surface of the gate structure. After removing the thickness portion of the first dielectric material layer 153, the sidewall spacer 132 on the sidewall surface of the gate structure may be exposed.

In one embodiment, the gate mask 131 may be formed on the gate structure. Therefore, after removing the thickness portion of the first dielectric material layer 153, the top of the first dielectric layer 151 may be not only lower than the top of the gate mask 131, but also lower than the top of the gate structure. In other words, in a direction perpendicular to the surface of the substrate 110, the top of the first dielectric layer 151 may be lower than an interface between the gate structure and the gate mask 131.

As shown in FIG. 4, in one embodiment, the gate structure may be the dummy gate structure 130. After removing the thickness portion of the first dielectric material layer 153, the top of the first dielectric layer 151 may be lower than the top of the dummy gate structure 130. The sidewall spacer 132 may be formed on the sidewall surface of the dummy gate structure 130, and the gate mask 131 may be formed on the dummy gate structure 130. Therefore, the top of the first dielectric layer 151 may be lower than the top of the dummy gate structure 130, and the sidewall spacer 132 on the sidewall surface of the dummy gate structure 130 may be exposed.

In addition, in one embodiment, the first dielectric material layer 153 may be formed by a flowable chemical vapor deposition process, thus, a material density of the first dielectric layer 151 may be substantially low. The thickness portion of the first dielectric material layer 153 may be removed along the direction perpendicular to the surface of the base substrate, and a second dielectric layer with a higher material density may be subsequently formed on the first dielectric layer 151, such that a material density of a subsequently formed interlayer dielectric layer may effectively increase. Therefore, the occurrence of damages on the interlayer dielectric layer in a subsequent planarization process may be reduced, facilitating improving the yield and performance of the formed semiconductor structure.

In one embodiment, the first dielectric material layer 153 may be made of silicon oxide. Therefore, the first dielectric material layer 153 may be back-etched by a dry etching method to remove the thickness portion of the first dielectric material layer 153, such that the sidewall surface of the gate structure (e.g., the dummy gate structure 130) may be exposed.

A thickness of the removed portion of the first dielectric material layer 153 may not be too large nor too small. If the thickness of the removed portion of the first dielectric material layer 153 is too large, a thickness of the first dielectric layer 151 may be too small, and the probability of damaging the fin 120 and the source and drain doped region under the first dielectric layer 151 may increase. Also, if the thickness of the removed portion of the first dielectric material layer 153 is too large, an area of the exposed sidewall surface of the gate structure (e.g., the dummy gate structure 130) may be too large, and an isolation sidewall spacer subsequently formed on the sidewall surface of the gate structure (e.g., the dummy gate structure 130) may be too high. Therefore, a parasitic capacitance between the gate structure and a plug in the formed semiconductor structure may increase. If the thickness of the removed portion of the first dielectric material layer 153 is too small, an area of the exposed sidewall surface of the gate structure (e.g., the dummy gate structure 130) may be too small. Therefore, the subsequent formation of the isolation sidewall spacer on the gate structure (e.g., the dummy gate structure 130) may be affected, and the electrical isolation between the gate structure and the plug of the formed semiconductor structure may not be effectively enhanced.

In one embodiment, the thickness of the removed portion of the first dielectric material layer 153 may be in a range of approximately 350 Å-1000 Å, and the top of the first dielectric layer 151 may be lower than the top of the gate structure (e.g., the dummy gate structure 130).

Figure 5:
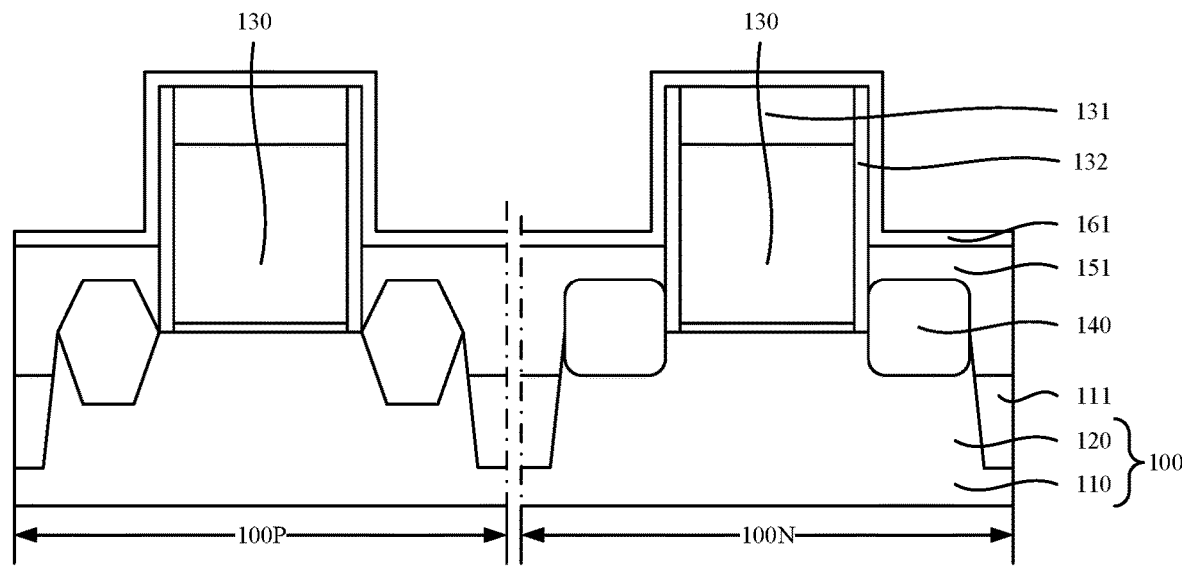
Figure 6:
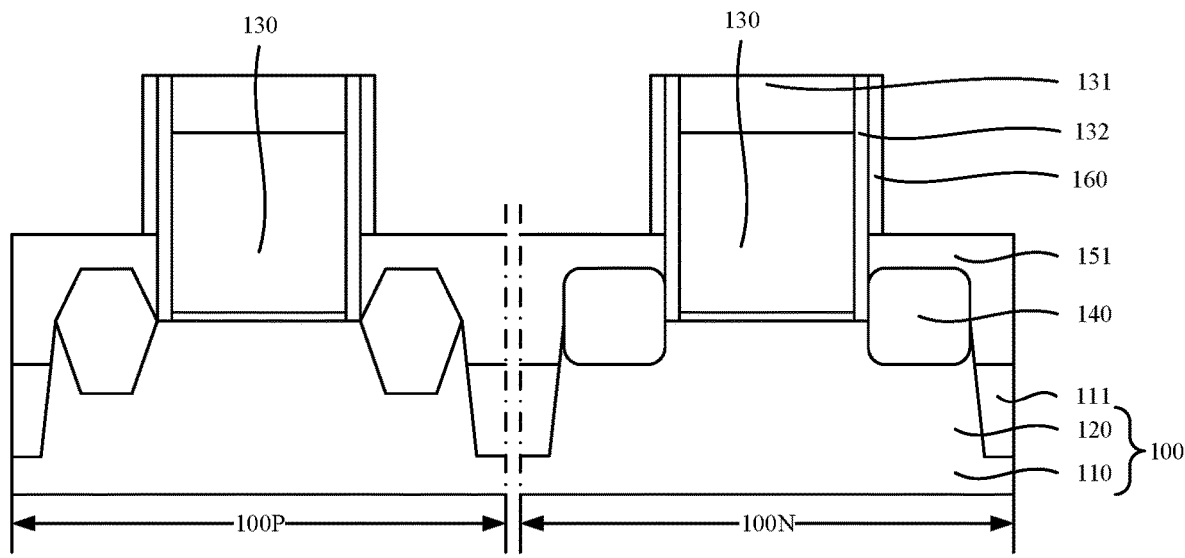

Returning to FIG. 12, after forming the first dielectric layer, an isolation sidewall spacer may be formed (S104). FIGS. 5-6 illustrate corresponding semiconductor structures.

Referring to FIG. 6, an isolation sidewall spacer 160 may be formed on the exposed sidewall surface of the gate structure. The isolation sidewall spacer 160 may effectively improve the performance of electrical isolation between the gate structure and a subsequently formed plug, reduce the occurrence of breakdown issue between the gate structure and the plug, and facilitate improving the reliability of the formed semiconductor structure.

In one embodiment, the first dielectric layer 151 may expose a surface of the sidewall spacer 132 on the sidewall surface of the dummy gate structure 130, and, thus, the isolation sidewall spacer 160 may cover the exposed surface of the sidewall spacer 132.

In one embodiment, the isolation sidewall spacer 160 may be made of a silicon nitride based material. For example, the isolation sidewall spacer 160 may be made of silicon nitride, silicon oxynitride, silicon carbonitride, or other suitable silicon nitride-based material(s). Use of the silicon nitride based material for the isolation sidewall spacer 160 may effectively reduce the probability of being etched during a subsequent process for forming the plug. This may facilitate increase of a thickness of the isolation sidewall spacer 160, facilitate increase of the distance between the plug and the gate structure, and facilitate decrease of occurrence probability of the breakdown issues. Moreover, use of the silicon nitride based material for the isolation sidewall spacer 160 may facilitate control of a dielectric constant of the material between the gate structure and the plug to facilitate preventing the parasitic capacitance between the gate structure and the plug from being too large, may realize the etching selectivity, and may reduce the parasitic capacitance.

In one embodiment, a thickness of the isolation sidewall spacer 160 may be in a range of approximately 8 nm-20 nm. That is, in a direction perpendicular to the sidewall surface of the gate structure (e.g., the dummy gate structure 130), the size of the isolation sidewall spacer 160 may be in a range of approximately 8 nm-20 nm.

If the thickness of the isolation sidewall spacer 160 is too small, the thickness of the remaining isolation sidewall spacer 160 may not be effectively increased, the distance between the plug and the gate structure may not be effectively increased, and the breakdown issue and reliability of the formed semiconductor structure may not be effectively improved. If the thickness of the isolation sidewall spacer 160 is too large, the dielectric constant of the material between the plug and the gate structure may increase, and the parasitic capacitance between the plug and the gate structure may increase, causing degradation of the performance of the formed semiconductor structure.

In one embodiment, forming the isolation sidewall spacer 160 may include: forming a sidewall spacer material layer 161 (referring to FIG. 5) to cover the gate structure (e.g., the dummy gate structure 130) and the surface of the first dielectric layer 151; and referring to FIG. 6, removing the sidewall spacer material layer 161 (illustrated in FIG. 5) on the top of the gate structure (e.g., the dummy gate structure 130) and on the first dielectric layer 151 to form the isolation sidewall spacer 160.

The sidewall spacer material layer 161 may provide a platform for forming the isolation sidewall spacer 160. In one embodiment, the isolation sidewall spacer 160 may be made of the silicon nitride based material, thus, the sidewall spacer material layer 161 may be made of the silicon nitride based material. The sidewall spacer material layer 161 may be formed by an atomic layer deposition process. The atomic layer deposition process may enable the formed sidewall spacer material layer 161 to have desired step coverage performance, such that the formed sidewall spacer material layer 161 may conformally cover the gate structure (e.g., the dummy gate structure 130) and the first dielectric layer 151, which may facilitate improving the quality of the isolation sidewall spacer 160 formed on the sidewall surface of the gate structure (e.g., the dummy gate structure 130).

In one embodiment, the gate mask 131 may be formed on the dummy gate structure 130. The sidewall spacer material layer 161 may conformally cover the dummy gate structure 130, the gate mask 131 and the first dielectric layer 151.

Therefore, the isolation sidewall spacer 160 may be further formed on the sidewall surface of the gate mask 131.

In one embodiment, the sidewall spacer material layer 161 on the top of the gate structure and on the first dielectric layer 151 may be removed. That is, the sidewall spacer material layer 161 on the top of the dummy gate structure 130 and on the first dielectric layer 151 may be removed, and the isolation sidewall spacer 160 may be formed on the sidewall surface of the dummy gate structure 130. Accordingly, the formation of the isolation sidewall spacer 160 may not affect the subsequent processes, and in particular, the difficulty for forming the plug in subsequent processes may be reduced, and the yield of the semiconductor structure may be improved.

In one embodiment, the sidewall spacer material layer 161 may be made of the silicon nitride based material, thus, a dry etching process may be used to remove the sidewall spacer material layer 161 on the top of the gate structure and on the first dielectric layer 151. The dry etching process may have desired anisotropy, and may be capable of effectively removing the sidewall spacer material layer 161 on the top of the gate structure (e.g., the dummy gate structure 130) and on the first dielectric layer 151 and reducing the influence of the removal process on the sidewall spacer material layer 161 on the sidewall surface of the gate structure (e.g., the dummy gate structure 130). Therefore, the quality of the formed isolation sidewall spacer 160 may be improved.

Figure 7:
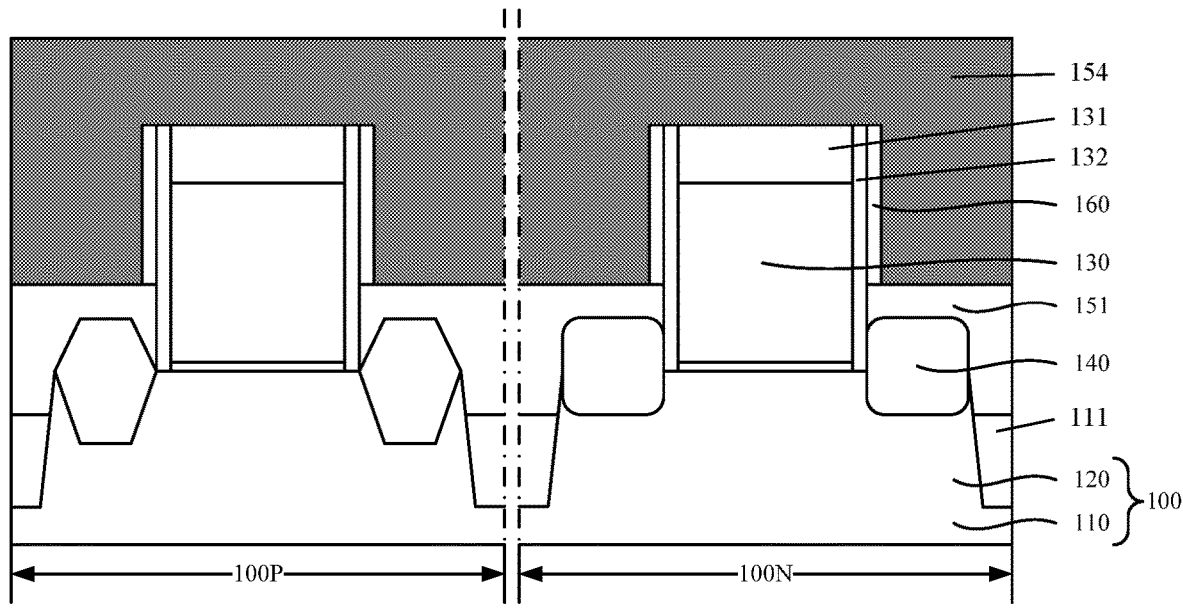
Figure 8:
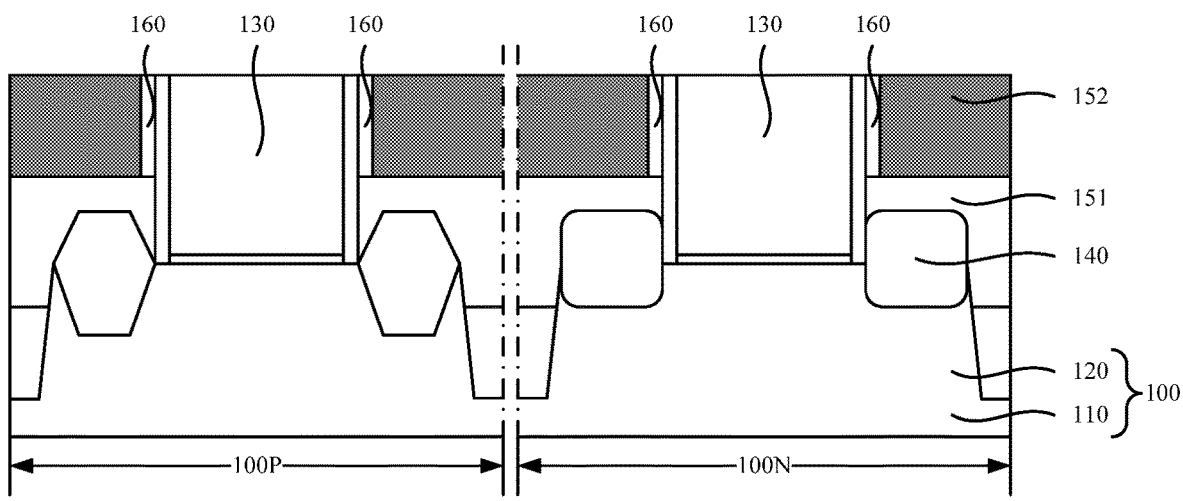

In one embodiment, the source and drain doped region may be formed in the base substrate 100 on both sides of the gate structure. Referring to FIGS. 7-8, after forming the sidewall spacer 160, a second dielectric layer 152 (illustrated in FIG. 8) may be formed on the first dielectric layer 151. Referring to FIG. 11, a contact hole (not illustrated) may be formed to penetrate through the first dielectric layer 151 and the second dielectric layer 152, where a bottom of the contact hole may expose the source and drain doped region, and a plug 180 may be formed in the contact hole.

For example, the source and drain doped region may be formed in the fin 120 on both sides of the dummy gate structure 130. Thus, the second dielectric layer 152 may cover the first dielectric layer 151 and the fin 120. The contact hole may penetrate through the first dielectric layer 151 and the second dielectric layer 152, and the bottom of the contact hole may expose the source and drain doped region in the fin 120 on both sides of the dummy gate structure 130.

In addition, in one embodiment, the semiconductor structure may include a metal gate structure. The metal gate structure may be formed by a high K last metal gate last process sequence.

Therefore, the gate structure may be the dummy gate structure 130. Referring to FIG. 8, a top of the second dielectric layer 152 may expose the dummy gate structure 130. After forming the second dielectric layer and before forming the plug, a gate opening 171 (illustrated in FIG. 9) may be formed to penetrate through the first dielectric layer 151 and the second dielectric layer 152 by removing the dummy gate structure 130, and the metal gate structure 174 including a gate dielectric layer 173 and a metal gate electrode 170 (illustrated in FIG. 10) may be formed in the gate opening 171. The formation process of the second dielectric layer 152, the metal gate structure 174, and the plug 180 may be described in detail with reference to the drawings.

Returning to FIG. 12, after forming the isolation sidewall spacer, a second dielectric layer may be formed (S105). FIGS. 7-8 illustrate corresponding semiconductor structures.

Referring to FIG. 8, a second dielectric layer 152 may be formed on the first dielectric layer 151. In one embodiment, the gate structure may be the dummy gate structure 130, a top of the second dielectric layer 152 may expose the dummy gate structure 130. In one embodiment, the source and drain doped region may be located in the fin 120 on both sides of the dummy gate structure 130, and the second dielectric layer 152 may cover the first dielectric layer 151 and the fin 120. The second dielectric layer 152 and the first dielectric layer 151 may together form an interlayer dielectric layer, to electrically isolate the adjacent semiconductor structures.

In one embodiment, the second dielectric layer 152 may have a material density greater than the first dielectric layer 151, thus, the material density of the formed interlayer dielectric layer may increase, and, the probability of occurrence of damages on the interlayer dielectric layer in subsequent processes may be reduced. In particular, during a subsequent planarization process, the second dielectric layer 152 with a substantially high material density may effectively improve the surface flatness of the interlayer dielectric layer, facilitating improving the yield and performance of the formed semiconductor structure.

In one embodiment, the second dielectric layer 152 may be made of silicon oxide. The second dielectric layer 152 may be formed by a plasma enhanced chemical vapor deposition (PECVD) process, or a high-density plasma chemical vapor deposition (HDP CVD) process. Therefore, the material density of the formed second dielectric layer 152 may be improved.

In one embodiment, the gate mask 131 may be formed on the gate structure, and the isolation sidewall spacer 160 may be formed on the sidewall surface of the gate mask 131. Forming the second dielectric layer 152 may include: referring to FIG. 7, forming a dielectric material layer 154 on the first dielectric layer 151 to cover the gate mask 131; and referring to FIG. 8, removing the dielectric material layer 154 above the gate structure, the gate mask 131 and the isolation sidewall spacer 160 on the sidewall surface of the gate mask 131 to form the second dielectric layer 152.

In one embodiment, the gate mask 131 may be formed on the dummy gate structure 130. The second dielectric layer 152 may be formed to expose the dummy gate structure 130 by removing the dielectric material layer 154 above the dummy gate structure 130, the gate mask 131 and a portion of the isolation sidewall spacer 160 on the sidewall surface of the gate mask 131.

The dielectric material layer 154 may provide a platform for forming the second dielectric layer 152. The second dielectric layer 152 may be made of silicon oxide, thus, the dielectric material layer 154 may also be made of silicon oxide. The dielectric material layer 154 may be made of highly dense silicon oxide through a plasma enhanced chemical vapor deposition (PECVD) process, or a high-density plasma chemical vapor deposition (HDP CVD) process.

The dielectric material layer 154 above the gate structure may be removed to expose the dummy gate structure 130, which may provide a platform for subsequently removing the gate structure.

In one embodiment, during the process of removing the dielectric material layer above the gate structure, a portion of each of the gate mask 131 and the isolation sidewall spacer 160 on the sidewall surface of the gate mask 131 may be removed. In one embodiment, a chemical mechanical polishing (CMP) process may be used to remove the dielectric material layer 154 above the gate structure, to remove the gate mask 131 along with the portion of the isolation sidewall spacer 160 on the sidewall surface of the gate mask 131. That is, a portion of the isolation sidewall spacer 160 on the sidewall surface of the gate mask 131 and a portion of the dielectric material layer above the gate mask 131 may be removed by a chemical mechanical polishing process. The remaining isolation sidewall spacer 160 may be located on the sidewall surface of the gate structure (e.g., the dummy gate structure 130). Accordingly, the dielectric constant of the material between the gate structure and a subsequently formed plug may be effectively reduced, facilitating control of the parasitic capacitance between the gate structure and the plug and improving the performance of the formed semiconductor structure.

Figure 9:
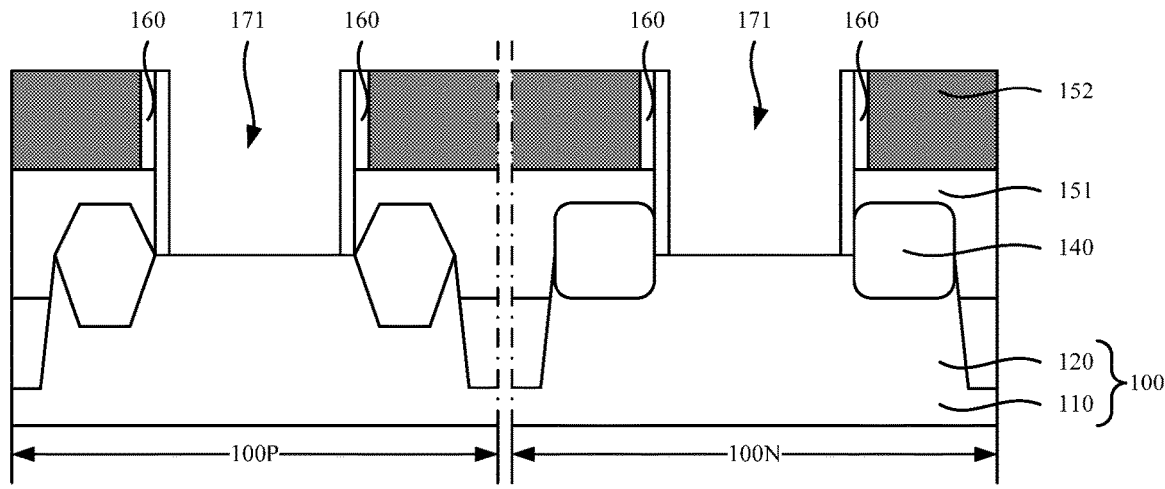

Returning to FIG. 12, after forming the second dielectric layer, a gate opening may be formed (S106). FIG. 9 illustrates a corresponding semiconductor structure.

Referring to FIG. 9, the dummy gate structure 130 (illustrated in FIG. 8) may be removed to form a gate opening 171. The gate opening 171 may penetrate through the second dielectric layer 152 and the first dielectric layer 151. The gate opening 171 may provide a process space for the formation of a metal gate structure.

In one embodiment, the base substrate 100 may include the substrate 110 and the fin 120. The dummy gate structure 130 may be across the length portion of the fin 120 and cover a portion of each of the top and the sidewall surfaces of the fin 120. Therefore, a bottom of the gate opening 171 may expose a portion of each of the top and the sidewall surfaces of the fin 120.

Returning to FIG. 12, after forming the gate opening, a metal gate structure may be formed (S107). FIG. 10 illustrates a corresponding semiconductor structure.

Referring to FIG. 10, a metal gate structure 174 may be formed in the gate opening 171 (illustrated in FIG. 9). The metal gate structure 174 may include a gate dielectric layer 173 and a metal gate electrode 170 on the gate dielectric layer 173. Forming the metal gate structure 174 in the gate opening 171 may include: forming the gate dielectric layer 173 on the base substrate 100 exposed at the bottom of the gate opening 171, and forming the metal gate electrode 170 on the gate dielectric layer 173.

The gate dielectric layer 173 may electrically isolate the metal gate electrode 170 and the channel in the base substrate 100. The gate dielectric layer 173 may be made of a high-K dielectric material, and the high-K dielectric material may be referred to a dielectric material having a relative dielectric constant greater than a relative dielectric constant of silicon oxide. In one embodiment, the gate dielectric layer may be made of $HfO_2$. In certain embodiments, the gate dielectric layer may be made of $ZrO_2$, HfSiO, HfSiON, HfTaO, HfTiO, HfZrO, or $Al_2O_3$, etc.

In one embodiment, the bottom of the gate opening may exposes a portion of each of the top and the sidewall surfaces of the fin 120. The gate dielectric layer 173 may be across the length portion of the fin 120 and on a portion of each of the top and the sidewall surfaces of the fin 120.

In one embodiment, the gate dielectric layer 173 may be formed by an atomic layer deposition process. In certain embodiments, the gate dielectric layer may be formed by a chemical vapor deposition process, a physical vapor deposition process, or other film deposition processes.

The metal gate electrode 170 may be used as an electrode to achieve electrical connection to external circuit. In one embodiment, the metal gate electrode 170 may be made of W. In certain embodiments, the metal gate may be made of Al, Cu, Ag, Au, Pt, Ni, or Ti, etc.

In one embodiment, the semiconductor structure may include the metal gate structure. A high-K last metal gate last process sequence is described for illustrative purposes. In certain embodiments, a high-K first metal gate last process sequence, or a high-K first metal gate first process sequence may be used.

Returning to FIG. 12, after forming the metal gate structure, a plug may be formed (S108). FIG. 11 illustrates a corresponding semiconductor structure.

Referring to FIG. 11, a contact hole (not illustrated) may be formed to penetrate through the first dielectric layer 151 and the second dielectric layer 152. A bottom of the contact hole may expose the source and drain doped region. The contact hole may provide a process space for the formation of the plug. A plug 180 may be formed in the contact hole.

In one embodiment, the source and drain doped region may include the stress layer 140, thus, the bottom of the contact hole may expose the stress layer 140. In one embodiment, the stress layer 140 may be covered with a contact etch stop layer (CESL). Forming the contact hole may include: sequentially etching the second dielectric layer 152 and the first dielectric layer 151 until the contact etch stop layer is exposed; and removing the contact etch stop layer to expose the stress layer 140.

In one embodiment, during the formation of the contact hole, an etching selectivity of the second dielectric layer 152 may be greater than an etching selectivity of the isolation sidewall spacer 160. That is, during the formation of the contact hole, the etched amount of the second dielectric layer 152 may be substantially large, and the etched amount of the isolation sidewall spacer 160 may be substantially small. Use of materials having different etching selectivity for the isolation sidewall spacer 160 and the second dielectric layer 152 may effectively reduce the loss amount of the isolation sidewall spacer 160 during the formation of the contact hole. Therefore, after forming the contact hole, the thickness of the remaining isolation sidewall spacer 160 may be increased, which may facilitate increase of a distance between the metal gate structure 174 and the plug 180, and facilitate improvement of the breakdown issues and reliability of the formed semiconductor structure.

In addition, as shown in FIG. 8, in one embodiment, the isolation sidewall spacer 160 may be formed merely on the sidewall surface of the gate structure. For example, as shown in FIG. 11, the isolation sidewall spacer 160 may be formed merely on the sidewall surface of the metal gate structure 174, and may not be formed on the top of the metal gate structure 174 and on the first dielectric layer 151. The contact hole may be formed by etching the first dielectric layer 151 and the second dielectric layer 152. The process difficulty for forming the contact hole may be effectively reduced, and the influence of the isolation sidewall spacer 160 on the formation of the plug may be reduced, facilitating improving the yield of the formed semiconductor structure.

Referring to FIG. 11, the plug 180 may be used to electrically connect the source and drain doped region to an external circuit. In one embodiment, the source and drain doped region may include the stress layer 140. The plug 180 may be located on the stress layer 140, and electrically connected to the stress layer 140.

In one embodiment, the semiconductor structure may be used to form a CMOS device, and the base substrate 100 may include the PMOS region 100P and the NMOS region 100N. Forming the plug 180 may include: forming a plurality of the plugs 180 electrically connected to the stress layer 140 in the PMOS region 100P of the base substrate 100 and to the stress layer 140 in the NMOS region 100N of the base substrate 100, respectively.

In one embodiment, before forming the contact hole, a capping layer 172 may be formed on the top of the metal gate structure 174. The capping layer 172 may protect the top of the metal gate structure 174 during the formation of the contact hole. The capping layer 172 may be made of silicon nitride.

In one embodiment, a radial size of the plug 180 may gradually increase in a direction away from the source and drain doped region. As shown in FIG. 11, a dimension 'd' of the plug 180 parallel to a length direction of the fin 120 may gradually increase in the direction away from the base substrate 100. Therefore, in a cross-section perpendicular to the surface of the substrate 110, the plug 180 may have a cross-section shape including an inverted trapezoid. Accordingly, the process difficulty of connecting the plug 180 and a subsequently formed interconnection structure may be effectively reduced, and the yield and performance of the formed semiconductor structure may be improved.

However, because the isolation sidewall spacer 160 may be formed on the sidewall surface of the metal gate structure and may be less affected by the etching process for forming the contact hole, the thickness of the isolation sidewall spacer 160 may be large. Forming the isolation sidewall spacer 160 on the sidewall surface of the metal gate structure 174 may effectively increase the distance between the metal gate structure 174 and the plug 180, and may improve the performance of electrical isolation between the metal gate structure 174 and the plug 180. Therefore, the breakdown issue between the gate structure and the plug may be effectively improved, and the reliability of the formed semiconductor structure may be improved.

In addition, as shown in FIG. 8, the isolation sidewall spacer 160 may be located on a portion of the sidewall surface of the gate structure exposed by the first dielectric layer 151, that is, the isolation sidewall spacer 160 may be partially located on the sidewall surface of the dummy gate structure 130. Therefore, as shown in FIG. 11, after forming the metal gate structure, the isolation sidewall spacer 160 may be located on a portion of the sidewall surface of the metal gate structure 174 exposed by the first dielectric layer 151. Accordingly, the dielectric constant of the material between the metal gate structure 174 and the plug 180 may be controlled, facilitating the reduction of the parasitic capacitance between the metal gate structure 174 and the plug 180. Therefore, the issue of increasing the parasitic capacitance caused by the formation of the isolation sidewall spacer 160 may be improved. In one embodiment, the disclosed fabrication method may be used to form a sub-7 nm FinFET device.

Accordingly, the present disclosure also provides a semiconductor structure. FIG. 11 illustrates a cross-sectional view of the semiconductor structure. Referring to FIG. 11, the semiconductor structure may include a base substrate 100, a gate structure on the base substrate 100, a source and drain doped region (e.g., a stress layer 140) in the base substrate 100 on both sides of the gate structure, a first dielectric layer 151 on the base substrate and having a top lower than the gate structure, and an isolation sidewall spacer 160 disposed on a sidewall surface of the gate structure and above the first dielectric layer 151.

The isolation sidewall spacer 160 may effectively improve the performance of electrical isolation between the gate structure and a subsequently formed plug, facilitate decrease of occurrence probability of breakdown issues between the gate structure and the plug, and facilitate improvement of the reliability of the formed semiconductor structure.

In one embodiment, the gate structure may be a metal gate structure 174. The metal gate structure may include a gate dielectric layer 173 and a metal gate electrode 170 on the gate dielectric layer 173. A top of the first dielectric layer 151 may be lower than a top of the metal gate structure 174, and a surface of a sidewall spacer on a sidewall surface of the metal gate structure 174 may be exposed. The isolation sidewall spacer 160 may cover the exposed surface of the sidewall spacer.

In one embodiment, the semiconductor structure may also include a plug 180 on the source and drain doped region and penetrating through the first dielectric layer 151. The isolation sidewall spacer 160 may effectively increase a distance between the metal gate structure 174 and the plug 180, and in particular, may prevent the distance between the metal gate structure 174 and the plug 180 from being too small. Therefore, the occurrence probability of breakdown issues between the metal gate structure 174 and the plug 180 may be effectively reduced, and the reliability of the semiconductor structure may be improved.

In one embodiment, the isolation sidewall spacer 160 may be made of a silicon nitride based material. That is, the isolation sidewall spacer 160 may be made of silicon nitride, silicon oxynitride, silicon carbonitride, or other suitable silicon nitride-based material(s). Use of the silicon nitride based material for the isolation sidewall spacer 160 may effectively reduce the probability of being etched during a process for forming the plug 180. This may facilitate increase of a thickness of the isolation sidewall spacer 160, facilitate increase of the distance between the plug 180 and the gate structure 174, and facilitate decrease of occurrence probability of the breakdown issues. Moreover, use of the silicon nitride based material for the isolation sidewall spacer 160 may facilitate control of a dielectric constant of the material between the gate structure 174 and the plug 180 to facilitate preventing the parasitic capacitance between the gate structure and the plug from being too large, may realize the etching selectivity, and may reduce the parasitic capacitance.

In one embodiment, a thickness of the isolation sidewall spacer 160 may be in a range of approximately 8 nm-20 nm. That is, in a direction perpendicular to the sidewall surface of the gate structure (e.g., the metal gate structure 170), the size of the isolation sidewall spacer 160 may be in a range of approximately 8 nm-20 nm.

If the thickness of the isolation sidewall spacer 160 is too small, the thickness of the remaining isolation sidewall spacer 160 may not be effectively increased, the distance between the plug 180 and the metal gate structure 170 may not be effectively increased, and the breakdown issue and reliability of the formed semiconductor structure may not be effectively improved. If the thickness of the isolation sidewall spacer 160 is too large, the dielectric constant of the material between the plug 180 and the metal gate structure 170 may increase, and the parasitic capacitance between the plug 180 and the metal gate structure 170 may increase, causing degradation of the performance of the formed semiconductor structure.

Accordingly, after forming the first dielectric layer, the isolation sidewall spacer may be formed on the sidewall spacer of the gate structure. The isolation sidewall spacer may effectively improve the performance of electrical isolation between the gate structure and the plug, facilitate reducing the occurrence probability of breakdown issues, and facilitate improving the reliability of the formed semiconductor structure.

After forming the isolation sidewall spacer, a second dielectric layer may be formed on the first dielectric layer. A contact hole may be formed to penetrate through the first dielectric layer and the second dielectric layer. The plug may be formed in the contact hole. During the formation of the contact hole, the etching selectivity of the second dielectric layer may be greater than the etching selectivity of the isolation sidewall spacer, therefore, the isolation sidewall spacer may be less etched, and the thickness of the remaining etched isolation sidewall spacer may be substantially large. Therefore, use of the material having small etching selectivity for the isolation sidewall spacer may facilitate increase of the distance between the plug 180 and the gate structure, facilitate decrease of occurrence probability of breakdown issues, and facilitate improvement of the reliability of the formed semiconductor structure.

The isolation sidewall spacer may be made of the silicon nitride based material, and silicon nitride may have high etching selectivity. Use of the silicon nitride based material for the isolation sidewall spacer 160 may effectively reduce the probability of being etched during a process for forming the plug 180. This may facilitate increase of a thickness of the isolation sidewall spacer 160, facilitate increase of the distance between the plug 180 and the gate structure 174, and facilitate decrease of occurrence probability of the breakdown issues. Moreover, use of the silicon nitride based material for the isolation sidewall spacer 160 may facilitate control of a dielectric constant of the material between the gate structure 174 and the plug 180 to facilitate preventing the parasitic capacitance between the gate structure and the plug from being too large, may realize the etching selectivity, and may reduce the parasitic capacitance.

The isolation sidewall spacer may be formed on the sidewall surface of the gate structure, and may not be formed on the top of the gate structure and on the first dielectric layer. Therefore, the process difficulty for forming the contact hole may be effectively reduced, and the influence of the isolation sidewall spacer on subsequent processes may be reduced, facilitating improving the yield of the semiconductor structure.

The isolation sidewall spacer may be formed on the sidewall spacer of the gate structure exposed by the first dielectric layer, thus, the dielectric constant of the material between the gate structure and the plug may be controlled, and the parasitic capacitance between the gate structure and the plug may be prevented from being too large.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   forming a gate structure on a base substrate;
   forming a source and drain doped region in the base substrate on both sides of the gate structure;
   forming a first dielectric layer on the base substrate and the source and drain doped region, wherein the first dielectric layer has a top surface lower than a top surface of the gate structure, directly on and covers a lower sidewall portion of the gate structure and the source and drain doped region, and exposes a higher sidewall portion of the gate structure;
   forming an isolation sidewall spacer on the exposed higher sidewall portion of the gate structure and directly on the top surface of the first dielectric layer;
   forming a second dielectric layer directly on the first dielectric layer and the isolation sidewall spacer, wherein the second dielectric layer has a material density higher than the first dielectric layer;
   forming a contact hole to penetrate through the first dielectric layer and the second dielectric layer, wherein a bottom of the contact hole exposes the source and drain doped region; and
   forming a plug in the contact hole.

2. The method according to claim 1, wherein:
   the isolation sidewall spacer is made of a silicon nitride based material.

3. The method according to claim 1, wherein:
   the isolation sidewall spacer has a thickness from a surface of the exposed higher sidewall portion of the gate structure in a range of approximately 8 nm 20 nm.

4. The method according to claim 1, wherein forming the isolation sidewall spacer includes:
   forming a sidewall spacer material layer to cover the gate structure and the first dielectric layer; and
   removing the sidewall spacer material layer from the top of the gate structure and from the first dielectric layer, wherein a remaining sidewall spacer material layer forms the isolation sidewall spacer.

5. The method according to claim 4, wherein:
   the sidewall spacer material layer is formed by an atomic layer deposition process.

6. The method according to claim 4, wherein:
   the sidewall spacer material layer is removed by a dry etching method.

7. The method according to claim 1, wherein:
   a gate mask is formed on the gate structure; and
   the isolation sidewall spacer is further formed on a sidewall surface of the gate mask.

8. The method according to claim 1, wherein forming the first dielectric layer includes:
   forming a first dielectric material layer on the base substrate to cover the gate structure, and
   removing a thickness portion of the first dielectric material layer along a direction perpendicular to a surface of the base substrate to form the first dielectric layer having the top lower than the gate structure,
   wherein the thickness portion of the removed first dielectric material layer is in a range of approximately 350 Å-1000 Å.

9. The method according to claim 1, wherein:
   when forming the contact hole,
   the second dielectric layer has an etching selectivity greater than the isolation sidewall spacer.

10. The method according to claim 1, wherein:
    a radial size of the plug gradually increases in a direction away from the source and drain doped region.

11. The method according to claim 1, wherein:
    the second dielectric layer is made of silicon oxide.

12. The method according to claim 1, wherein:
    the gate structure is a dummy gate structure, and
    a top of the second dielectric layer exposes the dummy gate structure, wherein after forming the second dielectric layer and before forming the plug, further including:
  forming a gate opening to penetrate through the second dielectric layer and the first dielectric layer by removing the dummy gate structure, and
  forming a metal gate structure in the gate opening.

13. The method according to claim 12, wherein:
a gate mask is formed on the gate structure, and
the isolation sidewall spacer is formed on a sidewall surface of the gate mask,
wherein forming the second dielectric layer includes:
  forming a dielectric material layer on the first dielectric layer to cover the gate mask, and
  forming the second dielectric layer by removing the dielectric material layer above the gate structure, the gate mask, and the isolation sidewall spacer on the sidewall surface of the gate mask.

14. The method according to claim 13, wherein removing the dielectric material layer above the gate structure, the gate mask, and the isolation sidewall spacer on the sidewall surface of the gate mask includes:
a chemical mechanical polishing process.

15. A semiconductor structure, comprising:
a gate structure on a base substrate;
source and drain doped regions in the base substrate on both sides of the gate structure;
a first dielectric layer on the base substrate, wherein the first dielectric layer has a top surface lower than a top surface of the gate structure and covers a lower sidewall portion of the gate structure;
an isolation sidewall spacer, disposed on a higher sidewall portion of the gate structure and above the first dielectric layer;
a second dielectric layer formed directly on the first dielectric layer and the isolation sidewall spacer, wherein the second dielectric layer has a material density higher than the first dielectric layer; and
a plug, on the source and drain doped region and penetrating through the first dielectric layer and the second dielectric layer, wherein the isolation sidewall spacer is disposed between the plug and the gate structure.

16. The semiconductor structure according to claim 15, wherein:
the isolation sidewall spacer is made of a silicon nitride based material.

17. The semiconductor structure according to claim 15, wherein:
the isolation sidewall spacer has a thickness from a surface of the sidewall portion of the gate structure in a range of approximately 8 nm 20 nm.

18. The semiconductor structure according to claim 15, wherein:
a radial size of the plug gradually increases in a direction away from the source and drain doped region.

* * * * *